US012801811B2

(12) United States Patent
Iodice et al.

(10) Patent No.: US 12,801,811 B2
(45) Date of Patent: Nov. 17, 2026

(54) CONFIGURABLE HOST APPLICATION FOR GENERATING DIGITAL TWINS

(71) Applicants: David M. Iodice, Melbourne, FL (US); Amanda Nicole Whites, Melbourne, FL (US); Chad Robert Mason, West Melbourne, FL (US)

(72) Inventors: David M. Iodice, Melbourne, FL (US); Amanda Nicole Whites, Melbourne, FL (US); Chad Robert Mason, West Melbourne, FL (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 917 days.

(21) Appl. No.: 18/184,494

(22) Filed: Mar. 15, 2023

(65) Prior Publication Data

US 2026/0111623 A1 Apr. 23, 2026

(51) Int. Cl.
*G06F 30/20* (2020.01)
*G06F 8/20* (2018.01)

(52) U.S. Cl.
CPC ................ *G06F 30/20* (2020.01); *G06F 8/20* (2013.01)

(58) Field of Classification Search
None
See application file for complete search history.

(56) References Cited

U.S. PATENT DOCUMENTS

| | | | | |
|---|---|---|---|---|
| 5,557,774 | A | 9/1996 | Shimabukuro et al. | |
| 11,487,918 | B2 | 11/2022 | Santhar et al. | |
| 12,159,148 | B2 * | 12/2024 | Iida | G06F 9/448 |
| 12,488,155 | B2 * | 12/2025 | Roper, Jr. | G06F 30/10 |
| 2019/0138662 | A1 | 5/2019 | Deutsch et al. | |
| 2022/0027529 | A1 | 1/2022 | Zarur et al. | |
| 2023/0185983 | A1 * | 6/2023 | Ramanasankaran | G06F 30/27 703/1 |

FOREIGN PATENT DOCUMENTS

| | | | | |
|---|---|---|---|---|
| CN | 117763851 | A | * | 3/2024 |
| JP | H06-348463 | A | | 12/1994 |
| WO | 2023/023407 | A1 | | 2/2023 |

OTHER PUBLICATIONS

CN 117763851 machine translation (Year: 2024).*

(Continued)

*Primary Examiner* — Paul S Schwarzenberg
(74) *Attorney, Agent, or Firm* — KATTEN MUCHIN ROSENMAN LLP

(57) ABSTRACT

Systems and methods are provided for generating a digital twin of a system component from a configurable host application. A personality profile defining a set of behaviors and interfaces associated with a system component associated with a system is generated and provided to an instance of a host application to configure the instance of host application to operate as a digital twin of the system component. The host application includes an input interface, an output interface, and a library of functions. The digital twin is used in a testing or operational environment in place of the system component.

17 Claims, 2 Drawing Sheets

(56) References Cited

OTHER PUBLICATIONS

Madni, et al.: "Augmenting MBSE with Digital Twin Technology: Implementation, Analysis, Preliminary Results, and Findings"; 2021 IEEE International Conference on Systems, Man, and Cybernetics (SMC) Oct. 17-20, 2021. Melbourne, Australia; the whole document.
WOISR (International Search Report and Written Opinion) for corresponding PCT/US2024/017948, mailed Jun. 24, 2024.
Japanese Office Action issued on May 26, 2026, for Japanese Patent Application No. 2025-538268, 7 sheets including English translation.

* cited by examiner

CONFIGURABLE HOST APPLICATION FOR GENERATING DIGITAL TWINS

TECHNICAL FIELD

This invention relates to information systems, and more particularly, to a configurable host application for generating digital twins.

BACKGROUND

System integrators typically do not get adequate documentation prior to delivery of products. With the advent of model-based system engineering, manufacturers need to have a place to capture the needed information to validate the system interactions prior to delivery of a product. However, even when third parties provide their model-based system engineering (MBSE) model of their product, the model has fundamental design differences which would require translation in order to be placed within a model for a system integrator. This can increase the necessary time and expense for integrating

SUMMARY

In accordance with one example, a method is provided. A personality profile defining a set of behaviors and interfaces associated with a system component associated with a system is generated and provided to an instance of a host application to configure the instance of host application to operate as a digital twin of the system component. The host application includes an input interface, an output interface, and a library of functions. The digital twin is used in a testing or operational environment in place of the system component.

In accordance with another example, a system includes a processor and a non-transitory computer readable medium storing machine-executable instructions for generating a digital twin for a system component. The machine-executable instructions include a personality profile that defines a set of interfaces and behaviors associated with the system component and a host application. The host application includes a service generator that constructs a service representing the digital twin from the personality profile and an executor module that executes the constructed service to provide the digital twin.

In accordance with a further example, a system includes a processor and a non-transitory computer readable medium storing machine-executable instructions for generating a digital twin for a system component. The machine-executable instructions include a specification parser that extracts data concerning a set of behaviors and interfaces associated with the system component from a structured or semi-structured data source to provide a personality profile and a host application. The host application includes a service generator that constructs a service representing the digital twin from the personality profile and an executor module that executes the constructed service to provide the digital twin.

BRIEF DESCRIPTION OF THE DRAWINGS

The foregoing and other features of the present disclosure will become apparent to those skilled in the art to which the present disclosure relates upon reading the following description with reference to the accompanying drawings, in which.

DETAILED DESCRIPTION

Figure 1:
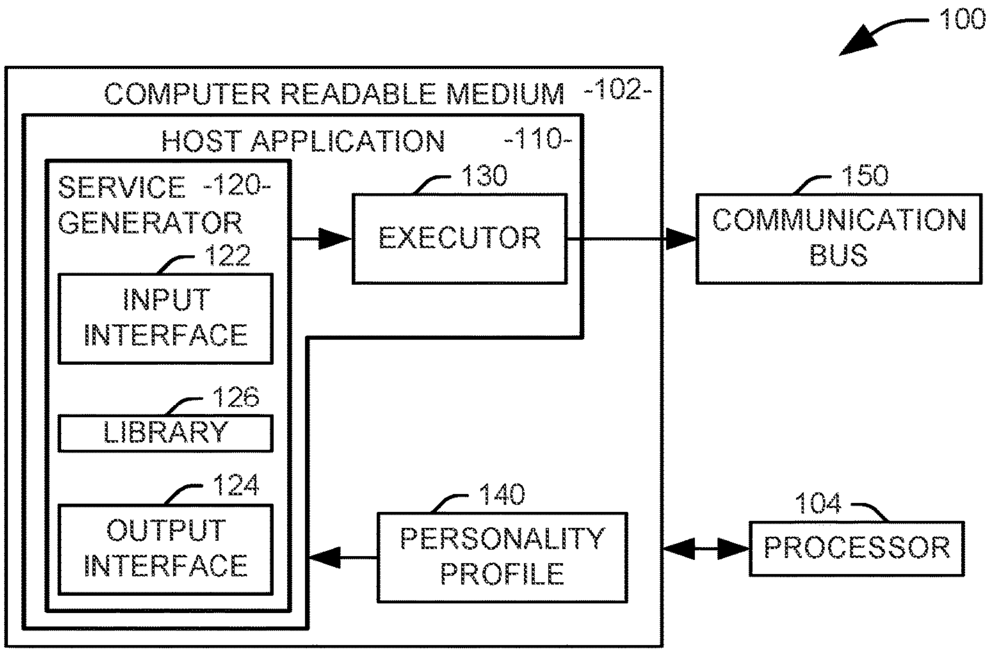
FIG. 1 illustrates an example of a system for providing a digital twin for a system component.

In the context of the present disclosure, the singular forms "a," "an" and "the" can also include the plural forms, unless the context clearly indicates otherwise. The terms "comprises" and/or "comprising," as used herein, can specify the presence of stated features, steps, operations, elements, and/or components, but do not preclude the presence or addition of one or more other features, steps, operations, elements, components, and/or groups.

As used herein, the term "and/or" can include any and all combinations of one or more of the associated listed items.

Additionally, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or acts/steps) is not limited to the order presented in the claims or figures unless specifically indicated otherwise.

As used herein, the term "substantially identical" or "substantially equal" refers to articles or metrics that are identical other than manufacturing or calibration tolerances.

As used herein, a "system component" is a component of a larger, integrated system, having an associated set of behaviors and interfaces, that can be implemented in dedicated hardware, as a software application executed by one or more associated processors, or as a mix of dedicated hardware and software.

As used herein, the term "digital twin" refers to a computer-implemented model, stored on a non-transitory computer readable medium that emulates the behavior of a system component, which can be physical system or software application used in a larger system. For example, a digital twin of a radar system should, for a given set of relevant conditions, such as the presence and nature of objects within the field of view, weather conditions, and similar factors, be able to accurately produce the output that a physical implementation of the radar system would produce. It will be appreciated that a digital twin can, and generally will, receive inputs from other digital twins and implemented elements of a system under evaluation and provide appropriate outputs representing the emulated physical system or software application.

As used herein, a "testing environment" is a controlled environment in which one or more digital twins are used in combination with other system components to evaluate the performance of either one of the other system components or a system component emulated by one of the digital twins.

As used herein, an "operational environment" is a system comprising a plurality of system components that is performing a function in response to at least one system that is external to the operational environment.

The systems and methods disclosed herein allow for creation of a personality profile from a service contract, existing model or manually that creates an interface digital twin of a system component based on the data. Conceptually, this allows a model-agnostic approach to the creation of digital twins that can be executed with varying degrees of fidelity. The advantages of this invention are being able to rapidly produce a testable digital twin of a system, thus reducing the time and cost of development. For example, an Open Mission Systems (OMS) service contract contains sufficient information to describe the interface and its behaviors in a standardized format, and the systems and methods purposed herein support retrieval of this information from a model or from any source that articulates the interfaces and behaviors. Accordingly, the digital twin can be created without having to import a third-party service into an existing system model or utilize add-on modules that autogenerate unique software code to emulate the functions and behaviors of the service.

FIG. 1 illustrates an example of a system 100 for providing a digital twin for a system component, which can include a physical system or subsystem, such as a sensor, or a software application, using a configurable, generic model. It will be appreciated that the system 100 can be implemented as software instructions stored on one or more non-transitory computer readable media 102 and executed by an associated processor 104 to provide the described functions. The system 100 includes a host application 110 that includes a service generator 120 that constructs a service representing the digital twin and an executor module 130 that executes the constructed service. The service generator includes an input interface 122, an output interface 124, and a library of behavior functions 126 that allow the service to emulate various behaviors associated with the system component.

A personality profile 140 defines a configuration of the host application 110 to mimic the behavior of the system component. The personality profile 140 defines a state machine for the system component, including a plurality of states for the system component and a plurality of defined conditions for transitioning among states. The personality profile 140 can also include data sets or specialized libraries associated with the system component. For example, a given data set can define outputs for the system component associated with various inputs or detected conditions. It will be appreciated that a personality profile 140 can be generated manually, from knowledge of and interaction with the system component, from a structured or semi-structured data source, for example, generated according to a defined standard, or from a digital model provided from a manufacturer of the system component. In one example, the personality profile 140 can be based on a Model Based System Engineering (MBSE) model or extracted from a service contract.

When the personality profile is provided to an instantiation of the host application 110, functions from the library 126 and, in some implementations, libraries and data sets incorporated into the personality profile 140, are used to create a service with behaviors and interfaces that mimic the system component. It will be appreciated that a fidelity of the emulation can be selected in generating the personality profile, with lower fidelity digital twins including a basic set of behaviors and higher fidelity digital twins utilizing more advanced behaviors using functions and data provided with the personality profile. The resulting digital twin can be used in a systems integration system to test and integrate a system that will incorporate the system component much earlier in the design implementation process, which greatly decreases the integration time when the system component is installed. To this end, the digital twin can communicate with other components of the environment via a communications bus 150, which can include, for example, a local bus, short-ranged wireless communication, or a network connection. The digital twin generated by the system of FIG. 1 will also allow system integrators to identify issues early on and correct issues on a timeline where the cost and impact of change may be reduced.

The illustrated system 100 allows for a conceptually simple host application 110 to have behavior and interfaces that can be defined by the personality profile 140 to mimic a system, such as a sensor, software application, or hardware system, using the personality profile to create a set of well-defined interfaces and execute a set of behaviors to form a digital twin. The host application 110 can utilize basic behaviors or execute a set of higher fidelity behaviors defined by supporting information, such as additional function libraries and data sets, referenced in the personality profile 140. Utilizing this generic host application provides a model-agnostic alternative to creating digital twins. Further, use of a configuration file as opposed to building unique source code has advantages in that the level of review necessary for developing a component at one classification level and then transferring it to system at another classification level for testing or other uses is sharply reduced, as the host application 110 is reused, leaving the personality profile as the only novel material for review. This provides both a savings in time and expense for transferring designs across levels of classifications and lowers the risk that sensitive material will be overlooked.

Figure 2:
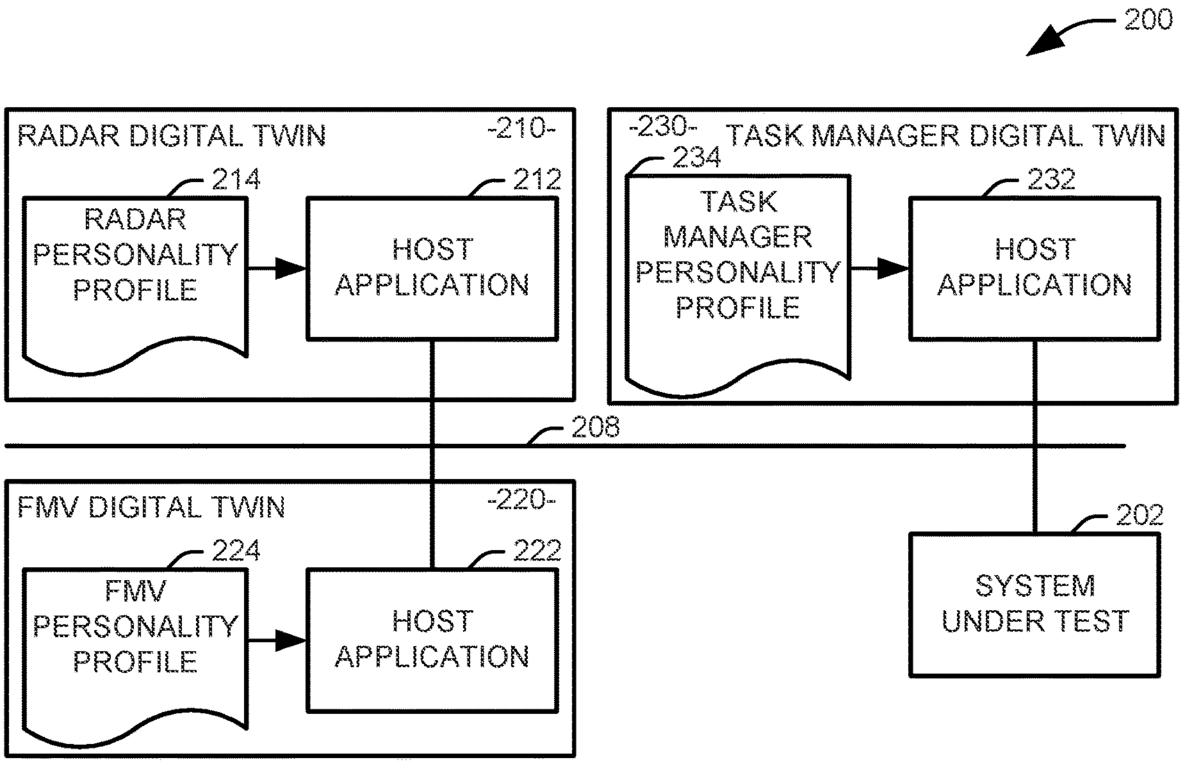
FIG. 2 illustrates one example of a system using digital twins generated via the system of FIG. 1.

In one example, the digital twin generated using the system of FIG. 1 can be used in an operational environment to mimic the behavior of another system with appropriate alterations, for example, via a change in the fidelity of the emulation, for the desired environment. For example, one or more digital twins could be configured into a cybersecurity honeypot shadow network where the behaviors of the digital twins are "similar" to the operational system, but of a fidelity that can be more easily targeted to evaluate the behavior of intruder apart from the operational network. The digital twins can also be used in a testing environment, and FIG. 2 illustrates one example of a system 200 using digital twins generated via the system of FIG. 1 in a testing environment. The system 200 includes a system under test 202 that is being evaluated or configured for use in a larger system. The system under test 202 is connected to a set of emulated system components implemented as digital twins 210, 220, and 230 via a communication bus 208. Each of the digital twins 210, 220, and 230 is implemented as an instantiation of a generic host application 212, 222, and 232, such as the host application 110 of FIG. 1, and an application-specific personality profile 214, 224, and 234 used to configure the generic host application to mimic the behaviors and interfaces of a given system component represented by the digital twin. Each personality profile 214, 224, 234 defines a state machine for its associated system component.

In the illustrated example, a first digital twin 210 represents a radar system. For this digital twin 210, the personality profile 214 can define a state machine for the radar system that is executed by the generic host application 212, as well as one or more data sets representing emulated outputs of the radar given various conditions, such as the positions and radar cross section of objects within a field of view of the radar. A second digital twin 220 represents a full motion video (FMV) sensor. The personality profile 224 associated with the second digital twin 220 defines a state machine for the FMV system that is executed by the generic host application 222, as well as one or more data sets representing video data and associated metadata that would be provided by such a sensor. A third digital twin 230 represents a task manager for the system, with a personality profile 234 defining a state machine for the task manager that is executed by the generic host application 232 to provide appropriate commands to the other components 202, 210, and 220 of the system in response to inputs from these components. The system under test 202 receives inputs from the digital twins 210, 220, and 230 and responses to any communications sent to the digital twins that emulate the data and responses expected from these systems, allowing the behavior of the system under test 202 to be evaluated in the testing environment without fully implemented versions of the system components emulated by the digital twins.

Figure 3:
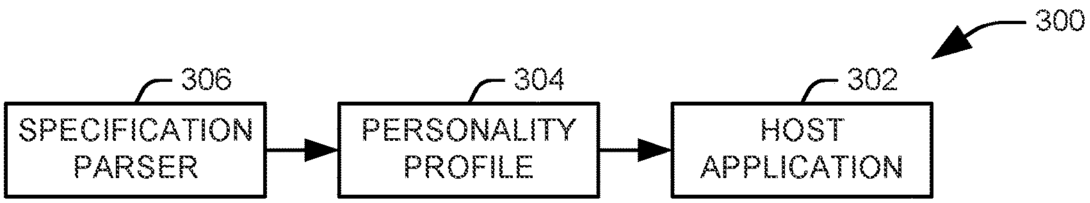
FIG. 3 illustrates a system for generating a digital twin from a structured or semi-structured data source.

FIG. 3 illustrates a system 300 for generating a digital twin from a structured or semi-structured data source. For example, with Air Force mandating the use of the Open Mission Systems (OMS) and Universal Command and Control Interface (UCI) in many acquisitions, there is now a standardized approach to defining the interfaces and behaviors of services, subsystems, and isolators, specifically the OMS Service Contract. The business objective of the Air Force is that a service contract would exist for each "unit of replaceability" and be sufficient for a third party to take the Service Contract and be able to replace or even enhance the functionality without the need to involve the original manufacturer. The system 300 of FIG. 3 leverages this mandate to create a more streamlined process that reduces the amount of system engineering and allows for more rapid testing and validation of interfaces and behaviors to reduce the timeline to get capabilities fielded. The current integration process starts with the design of the OMS Service and the models, with the developers creating the software as per the specifications. Once the OMS Service is built it can then be tested and compared to what is expected. OMS Services are delivered to system integrators from external and internal customers. The system of FIG. 3 enables the ability to test and integrate with the digital twin much earlier in the design implementation process, which greatly decreases the integration time when receiving the actual OMS Service. It will also allow system integrators to identify issues early on and correct issues on a timeline where the cost and impact of change may be less.

It will be appreciated that the illustrated system 300 can be implemented, for example, as software instructions stored on a non-transitory computer readable medium (not shown) and executed by an associated processor (not shown). In the illustrated system, a host application 302 uses a personality profile 304 extracted from a service contract or other structured or semi-structured data source to become a digital twin that then mimics both the interface and the behavior of the system component that it is emulating. A specification parser 306 extracts data concerning the behaviors and interfaces of a system component from the structured or semi-structured data source, such as an OMS contract. In particular, the specification parser 306 parses the structured or semi-structured data source to generate at least a state machine representing the system component. In one example, at least a portion of the structured or semi-structured data source is formatted as an extensible markup language (XML) schema. In some instances, the specification parser 306 can locate and extract one or more data sets or function libraires associated with the component. The data extracted from the specification parser 306 is compiled into a personality profile 304 and provided to the host application 302, which can be similar to that described in FIG. 1, to provide a digital twin representing the system component.

The digital twin created using the personality profile 304 contain the interface and behaviors provided through the service contract or other structured or semi-structured data source. In one example, the host application 302 is designed in a fashion to use the interfaces and behaviors provided through the configuration file along with additional supporting information in the personality profile 304 to provide varying levels of fidelity, or maturity, of the digital twin. Accordingly, multiple instantiations of the host application 302 with different configuration files will result in multiple digital twins of the system component that is described in their respective configuration files. There is significant advantage utilizing chameleon to emulate third-party system components in that the pedigree of the MBSE model/OMS Service Contract is validated through use of host application 302. The host application 302 allows a system integrator to provide an independent mechanism to create twins and ensure their operations are in accordance with the provided model or service contract.

Figure 4:
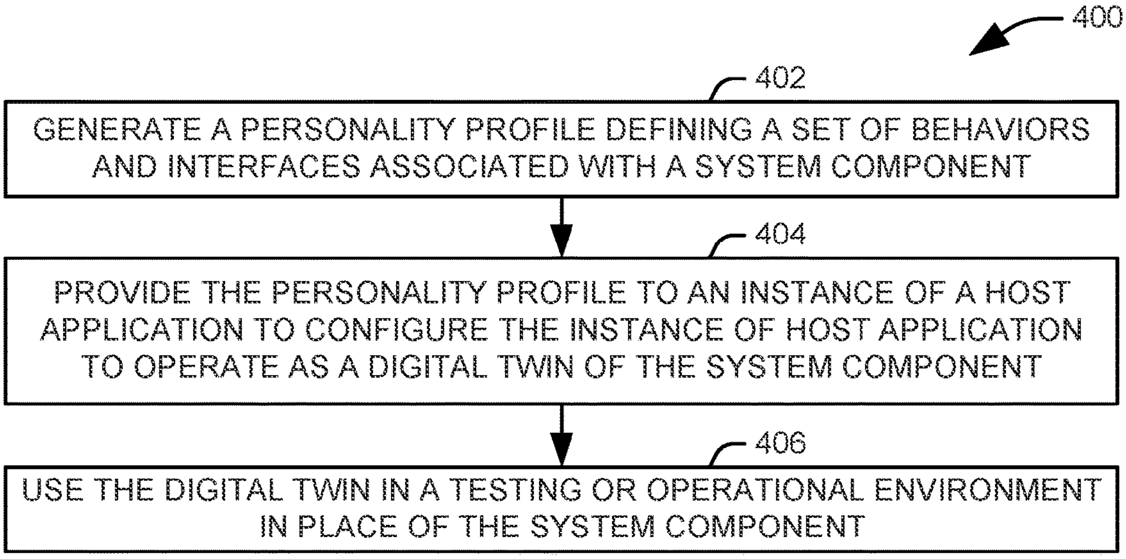
FIG. 4 illustrates a method for providing a digital twin using a configurable host interface.

In view of the foregoing structural and functional features described above, an example method will be better appreciated with reference to FIG. 4. While, for purposes of simplicity of explanation, the example method of FIG. 4 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method in accordance with the invention.

FIG. 4 illustrates a method 400 for providing a digital twin using a configurable host interface. At 402, a personality profile defining a set of behaviors and interfaces associated with a system component associated with a system is generated. The personality profile can be generated, for example, from a Model Based System Engineering model representing the system component, from data extracted from one of a structured and a semi-structured data source representing a specification for the system component, or by a human expert, from either or both of domain knowledge and interaction with the system component. In one example, the personality profile defines a state machine for the system component that can be implemented using a library of functions and data stored at a generic host application configurable by the personality profile to generate a digital twin. In another implementation, the personality profile also includes one or both of a data file representing outputs of the system component and one or more functions that are not present in the library of functions associate with the host application. It will be appreciated that the personality profile associated with a given system component can be generated as to generate a digital twin with a desired level of fidelity. For example, a first personality profile for a given system component may include only the defined state machine, and rely entirely on the library of functions and data associated with the host application. A second personality profile for the system component may include additional data sets and functions that are not present in the library associated with the host application, allowing for creation of a higher fidelity digital twin of the system component than would be provided by the first personality profile.

At 404, the personality profile is provided to an instance of a host application, comprising an input interface, an output interface, and a library of functions, to configure the instance of host application to operate as a digital twin of the system component. The personality profile can be used to select functions and data from the library associated with the host application to instantiate the state machine defined by the personality profile. For higher fidelity digital twins, additional data and functions included with the personality profile can also be used for this purpose. At 406, the digital twin is used in a testing or operational environment in place of the system component. For example, if the system component is a sensor, the digital twin can emulate an output for the sensor within the environment under various simulated conditions. It will be appreciated that steps 402 and 404 can be repeated, with different personality profiles representing different system components and additional instances of the generic host application, to provide multiple digital twins representing different system components of the larger system for use in the environment.

Figure 5:
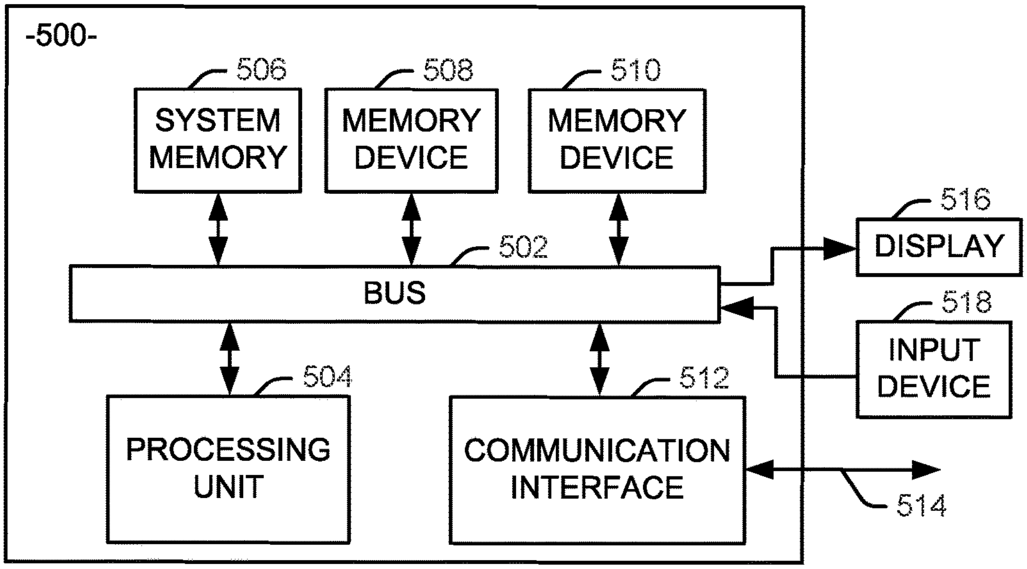
FIG. 5 is a schematic block diagram illustrating an exemplary system of hardware components capable of implementing examples of the systems and methods disclosed herein.

FIG. 5 is a schematic block diagram illustrating an exemplary system 500 of hardware components capable of implementing examples of the systems and methods disclosed herein. The system 500 can include various systems and subsystems. The system 500 can be a personal computer, a laptop computer, a workstation, a computer system, an appliance, an application-specific integrated circuit (ASIC), a server, a server BladeCenter, a server farm, etc.

The system 500 can include a system bus 502, a processing unit 504, a system memory 506, memory devices 508 and 510, a communication interface 512 (e.g., a network interface), a communication link 514, a display 516 (e.g., a video screen), and an input device 518 (e.g., a keyboard, touch screen, and/or a mouse). The system bus 502 can be in communication with the processing unit 504 and the system memory 506. The additional memory devices 508 and 510, such as a hard disk drive, server, standalone database, or other non-volatile memory, can also be in communication with the system bus 502. The system bus 502 interconnects the processing unit 504, the memory devices 506-510, the communication interface 512, the display 516, and the input device 518. In some examples, the system bus 502 also interconnects an additional port (not shown), such as a universal serial bus (USB) port.

The processing unit 504 can be a computing device and can include an application-specific integrated circuit (ASIC). The processing unit 504 executes a set of instructions to implement the operations of examples disclosed herein. The processing unit can include a processing core.

The additional memory devices 506, 508, and 510 can store data, programs, instructions, database queries in text or compiled form, and any other information that may be needed to operate a computer. The memories 506, 508 and 510 can be implemented as computer-readable media (integrated or removable), such as a memory card, disk drive, compact disk (CD), or server accessible over a network. In certain examples, the memories 506, 508 and 510 can comprise text, images, video, and/or audio, portions of which can be available in formats comprehensible to human beings. Additionally or alternatively, the system 500 can access an external data source or query source through the communication interface 512, which can communicate with the system bus 502 and the communication link 514.

In operation, the system 500 can be used to implement one or more parts of a system for generating and employing digital twins of system components, such as those illustrated in FIGS. 1-3. Computer executable logic for implementing the system resides on one or more of the system memory 506, and the memory devices 508 and 510 in accordance with certain examples. The processing unit 504 executes one or more computer executable instructions originating from the system memory 506 and the memory devices 508 and 510. The term "computer readable medium" as used herein refers to a medium that participates in providing instructions to the processing unit 504 for execution. This medium may be distributed across multiple discrete assemblies all operatively connected to a common processor or set of related processors.

Implementation of the techniques, blocks, steps, and means described above can be done in various ways. For example, these techniques, blocks, steps, and means can be implemented in hardware, software, or a combination thereof. For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above, and/or a combination thereof.

Also, it is noted that the embodiments can be described as a process which is depicted as a flowchart, a flow diagram, a data flow diagram, a structure diagram, or a block diagram. Although a flowchart can describe the operations as a sequential process, many of the operations can be performed in parallel or concurrently. In addition, the order of the operations can be re-arranged. A process is terminated when its operations are completed, but could have additional steps not included in the figure. A process can correspond to a method, a function, a procedure, a subroutine, a subprogram, etc. When a process corresponds to a function, its termination corresponds to a return of the function to the calling function or the main function.

Furthermore, embodiments can be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks can be stored in a machine-readable medium such as a storage medium. A code segment or machine-executable instruction can represent a procedure, a function, a subprogram, a program, a routine, a subroutine, a module, a software package, a script, a class, or any combination of instructions, data structures, and/or program statements. A code segment can be coupled to another code segment or a hardware circuit by passing and/or receiving information, data, arguments, parameters, and/or memory contents. Information, arguments, parameters, data, etc. can be passed, forwarded, or transmitted via any suitable means including memory sharing, message passing, ticket passing, network transmission, etc.

For a firmware and/or software implementation, the methodologies can be implemented with modules (e.g., procedures, functions, and so on) that perform the functions described herein. Any machine-readable medium tangibly embodying instructions can be used in implementing the methodologies described herein. For example, software codes can be stored in a memory. Memory can be implemented within the processor or external to the processor. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" can represent one or more memories for storing data, including read only memory (ROM), random access memory (RAM), magnetic RAM, core memory, magnetic disk storage mediums, optical storage mediums, flash memory devices and/or other machine-readable mediums for storing information. The term "machine-readable medium" includes, but is not limited to portable or fixed storage devices, optical storage devices, wireless channels, and/or various other storage mediums capable of storing that contain or carry instruction(s) and/or data.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on.

What is claimed is:

1. A method comprising:

generating a personality profile defining a set of behaviors and interfaces associated with a system component associated with a system;

providing the personality profile to an instance of a host application to configure the instance of host application to operate as a digital twin of the system component, wherein the host application comprises a service generator configured to construct a service representing the digital twin based on the personality profile; and using the digital twin in one of a testing environment and an operational environment in place of the system component, wherein the personality profile is a first personality profile, the system component is a first system component, the set of behaviors and interfaces is a first set of behaviors and interfaces, and the instance of the host application is a first instance of the host application, the method further comprising:

generating a second personality profile defining a second set of behaviors and interfaces associated with a second system component associated with the system;

providing the second personality profile to a second instance of the host application to configure the second instance of the host application to operate as a digital twin of the second system component; and using the digital twin of the second system component in the one of the testing environment and the operational environment in place of the second system component, wherein the first instance of the host application is configured to review only the first personality profile to operate as the digital twin of the first system component, and wherein the second instance of the host application is configured to review only the second personality profile to operate as the digital twin of the second system component.

2. The method of claim 1, wherein generating the personality profile comprises generating the personality profile from a Model Based System Engineering model representing the system component.

3. The method of claim 1, wherein generating the personality profile comprises extracting data from one of a structured and a semi-structured data source representing a specification for the system component.

4. The method of claim 1, wherein the personality profile comprises a data file representing outputs of the system component and at least one function that is not present in the library of functions.

5. The method of claim 4, wherein the second personality profile does not include a function; and the second digital twin emulating the system component with a fidelity less than that of the first digital twin.

6. The method of claim 1, wherein generating the personality profile comprises generating the personality profile by a human expert from knowledge of and interaction with the system component.

7. The method of claim 1, wherein the system component is a sensor, and using the digital twin in the one of the testing environment and the operational environment in place of the system component comprises using the digital twin to emulate an output for the sensor within the one of the testing and the operational environment.

8. A system comprising:

a processor; and a non-transitory computer readable medium storing machine-executable instructions for generating a digital twin for a system component, the machine-executable instructions comprising a host application comprising:

a service generator that constructs a service representing the digital twin from the personality profile; and an executor module that executes the constructed service to provide the digital twin, wherein the machine-executable instructions cause the processor to perform operations comprising:

generating a first personality profile defining a first set of behaviors and interfaces associated with a first system component associated with a system;

receiving a first personality profile at a first instance of a host application to configure the first instance of the host application to operate as a digital twin of the first system component, generating a second personality profile defining a second set of behaviors and interfaces associated with a second system component associated with the system; and receiving the second personality profile at a second instance of the host application to configure the second instance of the host application to operate as a digital twin of the second system component, wherein the first instance of the host application is configured to review only the first personality profile to operate as the digital twin of the first system component, and wherein the second instance of the host application is configured to review only the second personality profile to operate as the digital twin of the second system component.

9. The system of claim 8, wherein the service generator comprises a library of functions, the service generator selecting among the library of functions according to the set of interfaces and behaviors defined in the first and second personality profiles to construct the service.

10. The system of claim 9, wherein each of the first and second personality profiles defines a state machine for each system component.

11. The system of claim 10, wherein each of the first and second personality profiles further comprises at least one function that is not present in the library of functions.

12. The system of claim 10, wherein the first and second personality profiles further comprises a set of data representing outputs of the first and second system components.

13. The system of claim 8, further comprising a specification parser that extracts data concerning the set of behaviors and interfaces associated with the first and second system components from a structured or semi-structured data source to provide the personality profile.

14. A system comprising:

a specification parser that extracts data concerning a set of behaviors and interfaces associated with a system component from a structured or semi-structured data source to provide a personality profile;

a processor; and a non-transitory computer readable medium storing machine-executable instructions for generating a digital twin for a system component, the machine-executable instructions comprising a host application comprising:

a service generator that constructs a service representing the digital twin from the personality profile received from the specification parser; and an executor module that executes the constructed service to provide the digital twin, wherein the machine-executable instructions cause the processor to perform operations comprising:

generating a first personality profile defining a first set of behaviors and interfaces associated with a first system component associated with a system;

receiving a first personality profile at a first instance of a host application to configure the first instance of the host application to operate as a digital twin of the first system component, generating a second personality profile defining a second set of behaviors and interfaces associated with a second system component associated with the system; and receiving the second personality profile at a second instance of the host application to configure the second instance of the host application to operate as a digital twin of the second system component, wherein the first instance of the host application is configured to review only the first personality profile to operate as the digital twin of the first system component, and wherein the second instance of the host application is configured to review only the second personality profile to operate as the digital twin of the second system component.

15. The system of claim 14, wherein the service generator comprises a library of functions, the service generator selecting among the library of functions according to the set of interfaces and behaviors defined in the first and second personality profiles to construct the service.

16. The system of claim 15, wherein each of the first and second personality profiles defines a state machine for each system component and comprises at least one function that is not present in the library of functions and a set of data representing outputs of each system component.

17. The system of claim 15, wherein the structured or semi-structured data source is a structured data source prepared in accordance with a predefined standard.

* * * * *